United States Patent
Nandi et al.

(10) Patent No.: US 12,426,342 B2
(45) Date of Patent: Sep. 23, 2025

(54) LOW GERMANIUM, HIGH BORON SILICON RICH CAPPING LAYER FOR PMOS CONTACT RESISTANCE THERMAL STABILITY

(71) Applicant: Intel Corporation, Santa Clara, CA (US)

(72) Inventors: Debaleena Nandi, Hillsboro, OR (US); Cory Bomberger, Portland, OR (US); Gilbert Dewey, Beaverton, OR (US); Anand S. Murthy, Portland, OR (US); Mauro Kobrinsky, Portland, OR (US); Rushabh Shah, Hillsboro, OR (US); Chi-Hing Choi, Portland, OR (US); Harold W. Kennel, Portland, OR (US); Omair Saadat, Beaverton, OR (US); Adedapo A. Oni, North Plains, OR (US); Nazila Haratipour, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 893 days.

(21) Appl. No.: 17/359,327

(22) Filed: Jun. 25, 2021

(65) Prior Publication Data

US 2022/0416050 A1    Dec. 29, 2022

(51) Int. Cl.
*H10D 64/62* (2025.01)
*H10D 30/62* (2025.01)
(Continued)

(52) U.S. Cl.
CPC ......... *H10D 64/62* (2025.01); *H10D 30/6211* (2025.01); *H10D 30/6713* (2025.01); *H10D 30/6735* (2025.01); *H10D 30/6757* (2025.01); *H10D 62/118* (2025.01); *H10D 62/151* (2025.01); *H10D 62/832* (2025.01)

(58) Field of Classification Search
CPC ................ H01L 29/45; H01L 29/0847; H01L 29/42392; H01L 29/78696; H10D 64/62; H10D 30/6211; H10D 30/6713
See application file for complete search history.

(56) References Cited

U.S. PATENT DOCUMENTS

2019/0280115 A1    9/2019  Li
2019/0334027 A1   10/2019  Duriez

FOREIGN PATENT DOCUMENTS

WO    WO-2018125082    7/2018

OTHER PUBLICATIONS

Extended European Search Report for European Patent Application No. 22180459.4 mailed Nov. 17, 2022, 7 pgs.

(Continued)

*Primary Examiner* — Matthew L Reames
(74) *Attorney, Agent, or Firm* — Schwabe, Williamson & Wyatt P.C.

(57) ABSTRACT

Embodiments disclosed herein include semiconductor devices with improved contact resistances. In an embodiment, a semiconductor device comprises a semiconductor channel, a gate stack over the semiconductor channel, a source region on a first end of the semiconductor channel, a drain region on a second end of the semiconductor channel, and contacts over the source region and the drain region. In an embodiment, the contacts comprise a silicon germanium layer, an interface layer over the silicon germanium layer, and a titanium layer over the interface layer.

8 Claims, 7 Drawing Sheets

(51) Int. Cl.
    *H10D 30/67*     (2025.01)
    *H10D 62/10*     (2025.01)
    *H10D 62/13*     (2025.01)
    *H10D 62/832*     (2025.01)

(56) References Cited

OTHER PUBLICATIONS

Office Action for European Patent Application No. 22180459.4 mailed Jun. 2, 2025, 5 pgs.

LOW GERMANIUM, HIGH BORON SILICON RICH CAPPING LAYER FOR PMOS CONTACT RESISTANCE THERMAL STABILITY

TECHNICAL FIELD

Embodiments of the disclosure are in the field of semiconductor structures and processing and, in particular, to PMOS contact architectures for improving resistance subsequent to thermal anneals.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

In the manufacture of integrated circuit devices, multi-gate transistors, such as tri-gate transistors, have become more prevalent as device dimensions continue to scale down. Tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

DESCRIPTION OF THE EMBODIMENTS

Figure 1A:
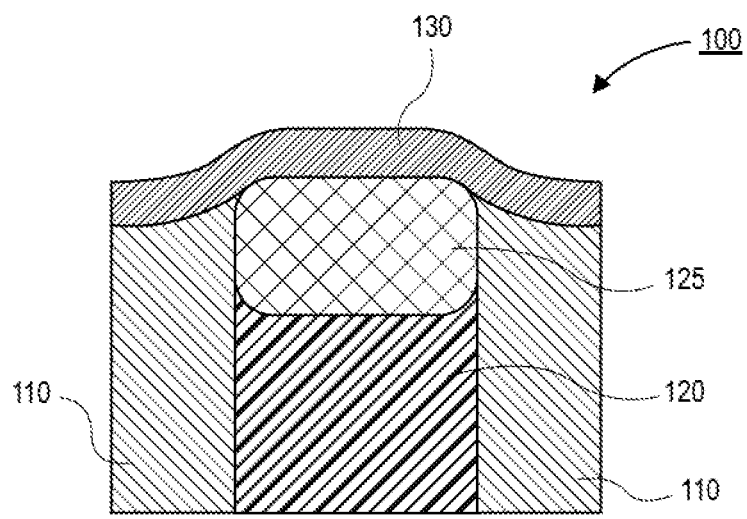
FIG. 1A is a cross-sectional illustration of a metal layer over a source/drain region, in accordance with an embodiment.

Embodiments described herein comprise PMOS contact architectures for improving resistance subsequent to thermal anneals. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Figure 1B:
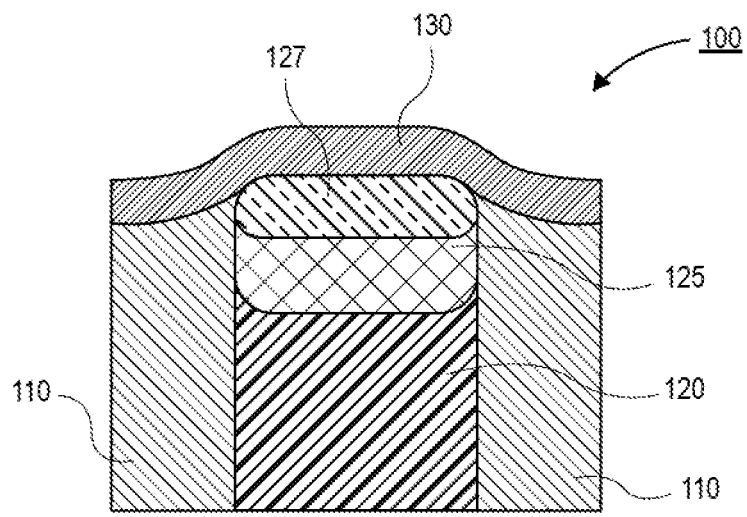
FIG. 1B is a cross-sectional illustration of the metal layer and the source/drain region after an anneal that shows degradation in the source/drain region due to titanium and silicon germanium interdiffusion, in accordance with an embodiment.

Embodiments disclosed herein include source/drain contact architectures that enable reduced contact resistances after thermal annealing processes in PMOS devices. Particularly, embodiments disclosed herein reduce the interdiffusion of silicon-germanium and an overlying titanium layer. The interdiffusion results in voids being formed in the silicon-germanium source/drain region, and, therefore, increases contact resistance. FIGS. 1A and 1B illustrate this interdiffusion mechanism.

As shown in FIG. 1A, semiconductor device 100 includes a source/drain region 120 with a silicon-germanium (SiGe) cap 125. The source/drain region 120 may be silicon or other semiconductor material. Insulative layer 110 may line the sidewalls of the source/drain region 120 and the SiGe cap 125. A conductive barrier layer 130 may be provided over a top surface of the SiGe cap 125. In a particular instance, the conductive barrier layer 130 is titanium or titanium nitride. It is to be appreciated that additional conductive materials, (e.g., tungsten) may be provided over the conductive barrier layer 130 to provide a contact to the source/drain region 120. In an embodiment, the conductive barrier layer 130 may comprise approximately 90 atomic percent titanium or more, or approximately 95 atomic percent titanium or more.

In an embodiment, the semiconductor device 100 may undergo a high temperature annealing process after the deposition of the conductive barrier layer 130. For example, the annealing process may have a temperature of approximately 400° C. or higher and a time duration of approximately 1 hour or longer. In a particular instance, the annealing process may be 450° C. for two hours.

FIG. 1B is a cross-sectional illustration of the semiconductor device 100 after the annealing process. As shown, interdiffusion between the SiGe cap 125 and the conductive barrier layer 130 occurs. The interdiffusion may result in the formation of a degraded region 127. The degraded region 127 in the SiGe cap 125 may include voids or other defects. The degraded region 127 results in an increase in the contact resistance at the source/drain region 120. As such, it is desirable to provide an interface that is more tolerant of the high temperature annealing process.

In some instances, co-depositing titanium and silicon (e.g., Ti—Si) can provide an interface that is more tolerant of the annealing process. However, existing semiconductor manufacturing tools do not generally have the capability of co-depositing titanium and silicon. As such, high volume manufacturing of such a material stack is not currently possible.

Accordingly, embodiments disclosed herein include semiconductor devices that comprise an interface layer between the SiGe cap 125 and the conductive barrier layer 130. The interface layer may be a low germanium, silicon rich layer. In some embodiments, the interface layer may also comprise boron. The interface layer allows for diffusion of silicon into the conductive barrier layer 130, and protects the underlying SiGe cap 125. The resulting structure may provide contact resistances that are approximately $2e^{-9}$ ohm·cm$^2$ or lower.

Figure 2A:
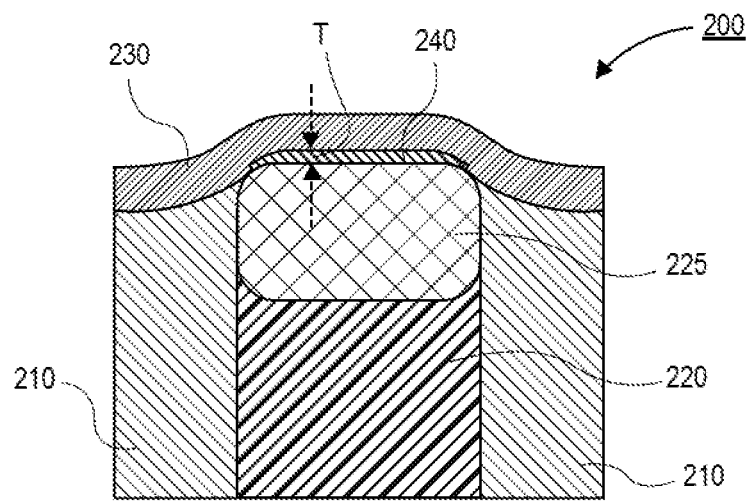
FIG. 2A is a cross-sectional illustration of a metal layer and an interface layer over a source/drain region, in accordance with an embodiment.

Referring now to FIG. 2A, a cross-sectional illustration of a semiconductor device 200 is shown, in accordance with an embodiment. In an embodiment, the semiconductor device 200 may comprise a PMOS transistor device. Any transistor architecture may be used for the semiconductor device 200. Examples of a fin-FET device and a gate-all-around (GAA) device are provided in greater detail below. In the illustrated embodiment, the contact architecture is shown as a front side contact. However, it is to be appreciated that substantially similar architectures may be suitable for backside contact architectures as well.

In an embodiment, the semiconductor device 200 may comprise a source/drain region 220. The source/drain region 220 may be an epitaxially grown semiconductor material. In some implementations, the source/drain region 220 may be a silicon alloy that is in-situ doped silicon germanium, in-situ doped silicon carbide, or in-situ doped silicon. In alternate implementations, other silicon alloys may be used. For instance, alternate silicon alloy materials that may be used include, but are not limited to, nickel silicide, titanium silicide, cobalt silicide, and possibly may be doped with one or more of boron and/or aluminum. In an embodiment, the semiconductor device 200 may comprise a cap layer 225 over the source/drain region 220. The cap layer 225 may be another semiconductor material. For example, the cap layer 225 may comprise SiGe.

The source/drain region 220 and the cap layer 225 may be lined by a dielectric layer 210. Examples of suitable dielectric materials include, but are not limited to, oxides of silicon (e.g., silicon dioxide (SiO$_2$)), doped oxides of silicon, fluorinated oxides of silicon, carbon doped oxides of silicon, various low-k dielectric materials known in the arts, and combinations thereof.

In an embodiment, an interface layer 240 is provided over the cap layer 225. The interface layer 240 may be a material that limits the interdiffusion between the cap layer 225 and an overlying barrier layer 230. In an embodiment, the barrier layer 230 may comprise titanium or titanium nitride. In an embodiment, the barrier layer 230 may comprise approximately 90 atomic percent titanium or more, or approximately 95 atomic percent titanium or more. In an embodiment, the interface layer 240 may have a thickness T. For example, the thickness T may be approximately 10 nm or smaller. In a particular embodiment, the thickness T may be between approximately 2 nm and approximately 6 nm. The interface layer 240 may be a silicon rich material with a low atomic percentage of germanium. For example, the atomic percentage of germanium may be approximately 15 percent or lower. In a particular embodiment, the atomic percentage of germanium in the interface layer 240 may be between approximately 0 percent and approximately 10 percent. In some embodiments, the interface layer 240 may also comprise a high concentration of boron. For example, a boron concentration may be approximately $9e^{20}$ atoms/cm$^3$, or between approximately $2e^{21}$ atoms/cm$^3$ and approximately $4e^{21}$ atoms/cm$^3$.

It is to be appreciated that interface layers 240, such as those described above, are high volume manufacturing compatible. For example, the interface layer 240 may be deposited with an epitaxial growth process. For example, chemical vapor deposition (CVD) may be used to selectively grow the interface layer 240 over the cap layer 225. Since the growth is selective, the interface layer 240 may not extend between the barrier layer 230 and the dielectric layer 210.

After deposition of the barrier layer 230, an annealing process may be implemented. In an embodiment, the annealing process may have a temperature of approximately 400° C. or higher and a time duration of approximately 1 hour or longer. In a particular embodiment, the annealing process may be 450° C. for two hours. The resulting structure after the annealing process is shown in FIG. 2B.

Figure 2B:
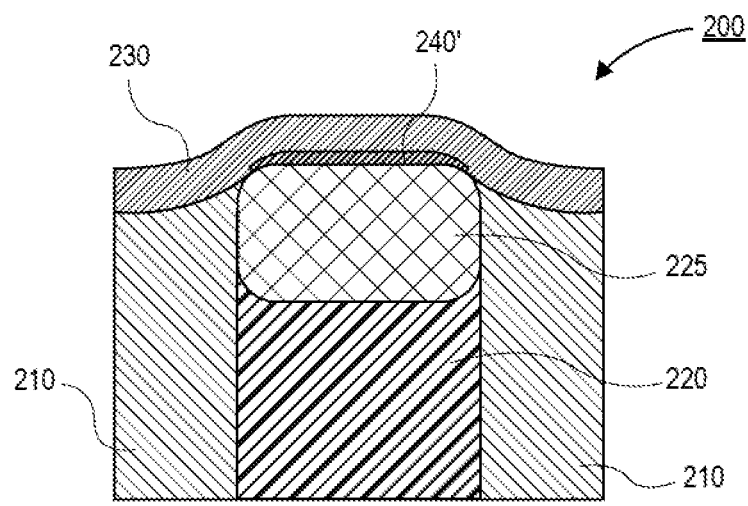
FIG. 2B is a cross-sectional illustration of the metal layer and the source/drain region with the interface layer consumed by the metal layer, in accordance with an embodiment.

Referring now to FIG. 2B, a cross-sectional illustration of the semiconductor device 200 after the annealing process is shown, in accordance with an embodiment. In an embodiment, the annealing process results in the interface layer 240 being consumed by the barrier layer 230. For example, a region 240' of the barrier layer 230 may have constituents of the interface layer 240. That is, in some embodiments, there may not be a discernable layer remaining between the barrier layer 230 and the cap layer 225. Stated differently, a TEM image of a cross-section of the source/drain region 220 and the overlying contact may only show an interface between the barrier layer 230 and the cap layer 225.

Figure 3:
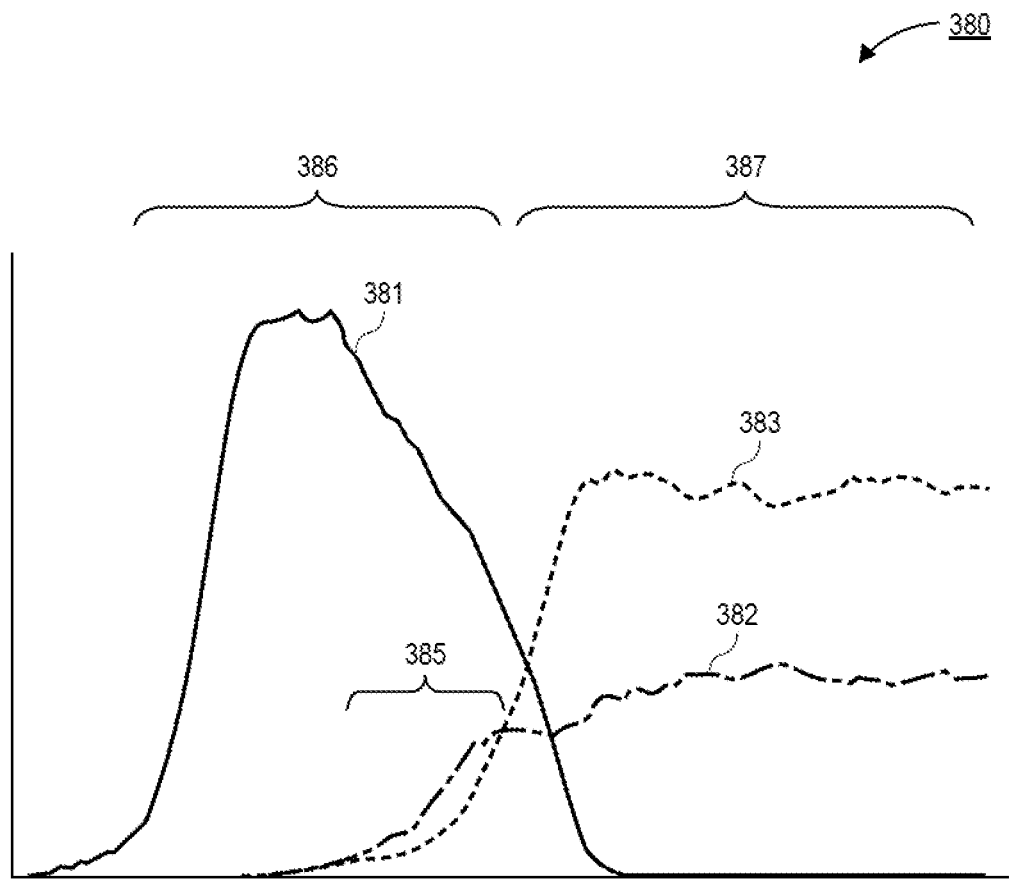
FIG. 3 is an EDX line scan of the interface between the metal layer and the source/drain region, in accordance with an embodiment.

While the interface layer 240 may not always be discernable with TEM imaging, it is to be appreciated that embodiments are still detectable using other analysis techniques. For example, FIG. 3 is a chart of an EDX line scan 380 through a thickness of the barrier layer 230 and the cap layer 225. As shown in FIG. 3, line 381 is the titanium (or titanium nitride) concentration, line 382 is the silicon concentration, and line 383 is the germanium concentration. The X-axis is the depth into the structure. Region 386 corresponds to the barrier layer 230, and region 387 corresponds to the cap layer 225. Due to diffusion of the silicon rich interface layer 240 into the barrier layer 230, the silicon concentration in the barrier layer 230 is greater than the concentration of germanium. Particularly, in region 385 the silicon line 382 is above the germanium line 383.

The diffusion of the interface layer 240 significantly reduces interdiffusion between the barrier layer 230 and the cap layer 225. As such, there is a significant reduction in voiding and other defects in the cap layer 225 compared to an architecture similar to the architecture shown in FIG. 1A and FIG. 1B. The reduction in voids provides a lower contact resistance between the barrier layer 230 and the cap layer 225. For example, a contact resistance of the semiconductor device 200 may be approximately $2e^{-9}$ ohm·cm$^2$ or lower.

Figure 4:
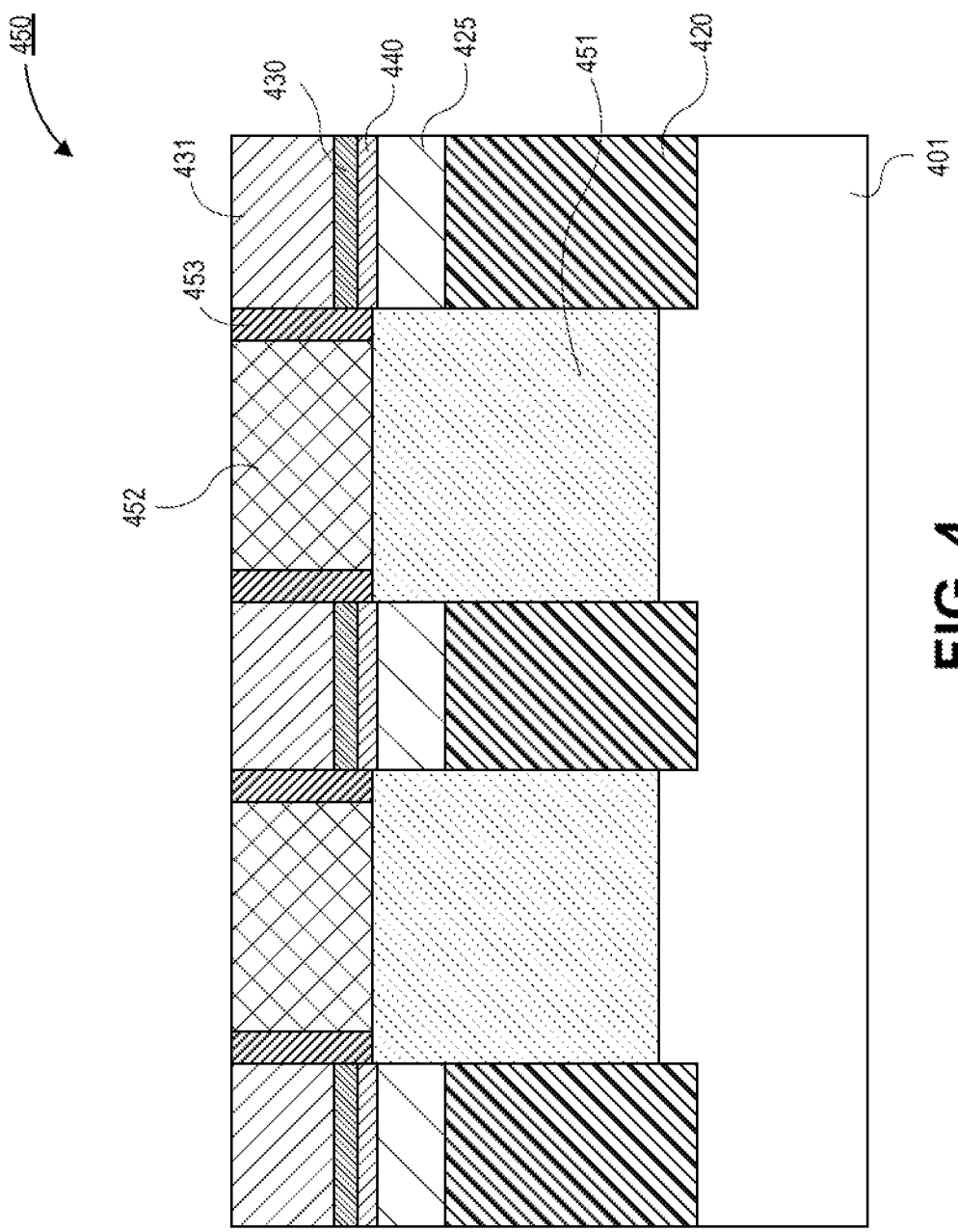
FIG. 4 is a cross-sectional illustration of a fin-FET transistor device with an interface layer between the metal layer and the source/drain region, in accordance with an embodiment.

Referring now to FIG. 4, a cross-sectional illustration of a semiconductor device 450 is shown, in accordance with an embodiment. In an embodiment, the semiconductor device 450 may comprise a substrate 401, such as a semiconductor substrate. The semiconductor substrate 401 often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials.

In an embodiment, a semiconductor fin 451 extends up from the substrate 401. The fin 451 may be surrounded by a gate stack 452. The gate stack 452 is over a top surface of the fin 451 in FIG. 4, but it is to be appreciated that the gate stack 452 wraps down along sidewalls of the fin 451 into and out of the plane of FIG. 4. An insulative gate spacer 453 may line sidewalls of the gate stack 452. While shown as a single material, it is to be appreciated that the gate stack 452 comprises a gate dielectric, a workfunction metal, and a fill metal.

The gate dielectric may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

When the workfunction metal will serve as a P-type workfunction metal, the gate workfunction metal may have a workfunction that is between about 4.9 eV and about 5.2 eV. P-type materials that may be used to form the workfunction metal include, but are not limited to, ruthenium, palladium, platinum, cobalt, nickel, and conductive metal oxides, e.g., ruthenium oxide. The fill metal may comprise a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example.

Source/drain regions 420 may be provided on opposite ends of the fin 451. The source/drain regions 420 may be epitaxially grown semiconductor material. In the illustrated embodiment, a cap layer 425 may be provided over the source/drain region 420. In an embodiment, the source/drain regions 420 may comprise silicon and the cap layer 425 may comprise SiGe.

In an embodiment, an interface layer 440 is provided over the cap layer 425. The interface layer 440 may be a low germanium, silicon rich layer. In some embodiments, the interface layer may also comprise boron. For example, the atomic percentage of germanium may be approximately 15 percent or lower. In a particular embodiment, the atomic percentage of germanium in the interface layer 440 may be between approximately 0 percent and approximately 10 percent. In some embodiments, the boron concentration may be approximately $9e^{20}$ atoms/cm$^3$, or between approximately $2e^{21}$ atoms/cm$^3$ and approximately $4e^{21}$ atoms/cm$^3$. In an embodiment, a thickness of the interface layer 440 may be between approximately 2 nm and approximately 6 nm. In an embodiment, a barrier layer 430 is provided over a top surface of the interface layer 440. For example, the barrier layer 430 may comprise titanium or titanium nitride.

In some embodiments, the interface layer 440 may not be discernable in a cross-sectional image of the semiconductor device 450. This is because the interface layer 440 may be consumed by the barrier layer 430 during an annealing process. In such embodiments, the analysis of the composition of the barrier layer (e.g., using EDX, APT, EELs, etc.) may identify the constituents of the interface layer 440 in the barrier layer 430, similar to the graph shown in FIG. 3. Particularly, a titanium silicide phase may be detected in the barrier layer 430. In an embodiment, a contact metal 431 may be provided over the barrier layer 430. The contact metal 431 may be any typical contact metal, such as tungsten.

Figure 5:
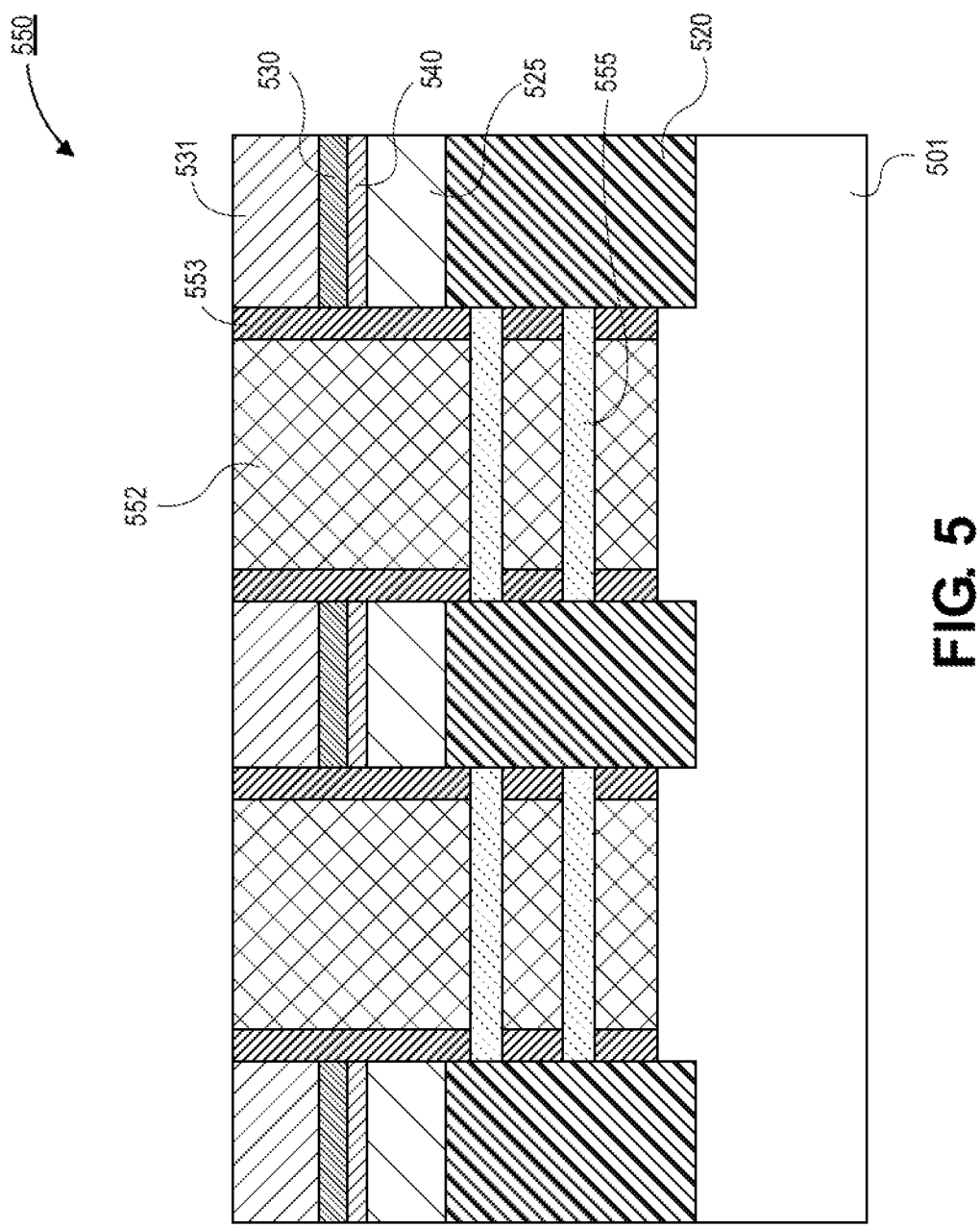
FIG. 5 is a cross-sectional illustration of a gate-all-around (GAA) transistor device with an interface layer between the metal layer and the source/drain region, in accordance with an embodiment.

Referring now to FIG. 5, a cross-sectional illustration of a semiconductor device 550 that is a GAA device is shown, in accordance with an embodiment. In an embodiment, the semiconductor device 550 may comprise a substrate 501, such as a semiconductor substrate. The substrate 501 may be substantially similar to the substrate 401 described in greater detail above.

In an embodiment, a plurality of semiconductor ribbons or wires 555 are provided above the substrate 501. The semiconductor wires 555 may be surrounded by a gate stack 552. The gate stack 552 wraps entirely around each of the semiconductor wires 555 into and out of the plane of FIG. 5. An insulative gate spacer 553 may line sidewalls of the gate stack 552. While shown as a single material, it is to be appreciated that the gate stack 552 comprises a gate dielectric, a workfunction metal, and a fill metal, similar to the gate stack 452 described in greater detail above.

Source/drain regions 520 may be provided on opposite ends of the semiconductor wires 555. The source/drain regions 520 may be epitaxially grown semiconductor material. In the illustrated embodiment, a cap layer 525 may be provided over the source/drain region 520. In an embodiment, the source/drain regions 520 may comprise silicon and the cap layer 525 may comprise SiGe.

In an embodiment, an interface layer 540 is provided over the cap layer 525. The interface layer 540 may be a low germanium, silicon rich layer. In some embodiments, the interface layer may also comprise boron. For example, the atomic percentage of germanium may be approximately 15 percent or lower. In a particular embodiment, the atomic percentage of germanium in the interface layer 440 may be between approximately 0 percent and approximately 10 percent. In some embodiments, the boron concentration may be approximately $9e^{20}$ atoms/cm$^3$, or between approximately $2e^{21}$ atoms/cm$^3$ and approximately $4e^{21}$ atoms/cm$^3$. In an embodiment, a thickness of the interface layer 540 may be between approximately 2 nm and approximately 6 nm. In an embodiment, a barrier layer 530 is provided over a top surface of the interface layer 540. For example, the barrier layer 530 may comprise titanium or titanium nitride.

In some embodiments, the interface layer 540 may not be discernable in a cross-sectional image of the semiconductor device 550. This is because the interface layer 540 may be consumed by the barrier layer 530 during an annealing process. In such embodiments, the analysis of the composition of the barrier layer (e.g., using EDX, APT, EELs, etc.) may identify the constituents of the interface layer 540 in the barrier layer 530, similar to the graph shown in FIG. 3. Particularly, a titanium silicide phase may be detected in the barrier layer 530. In an embodiment, a contact metal 531 may be provided over the barrier layer 530. The contact metal 531 may be any typical contact metal, such as tungsten.

Figure 6:
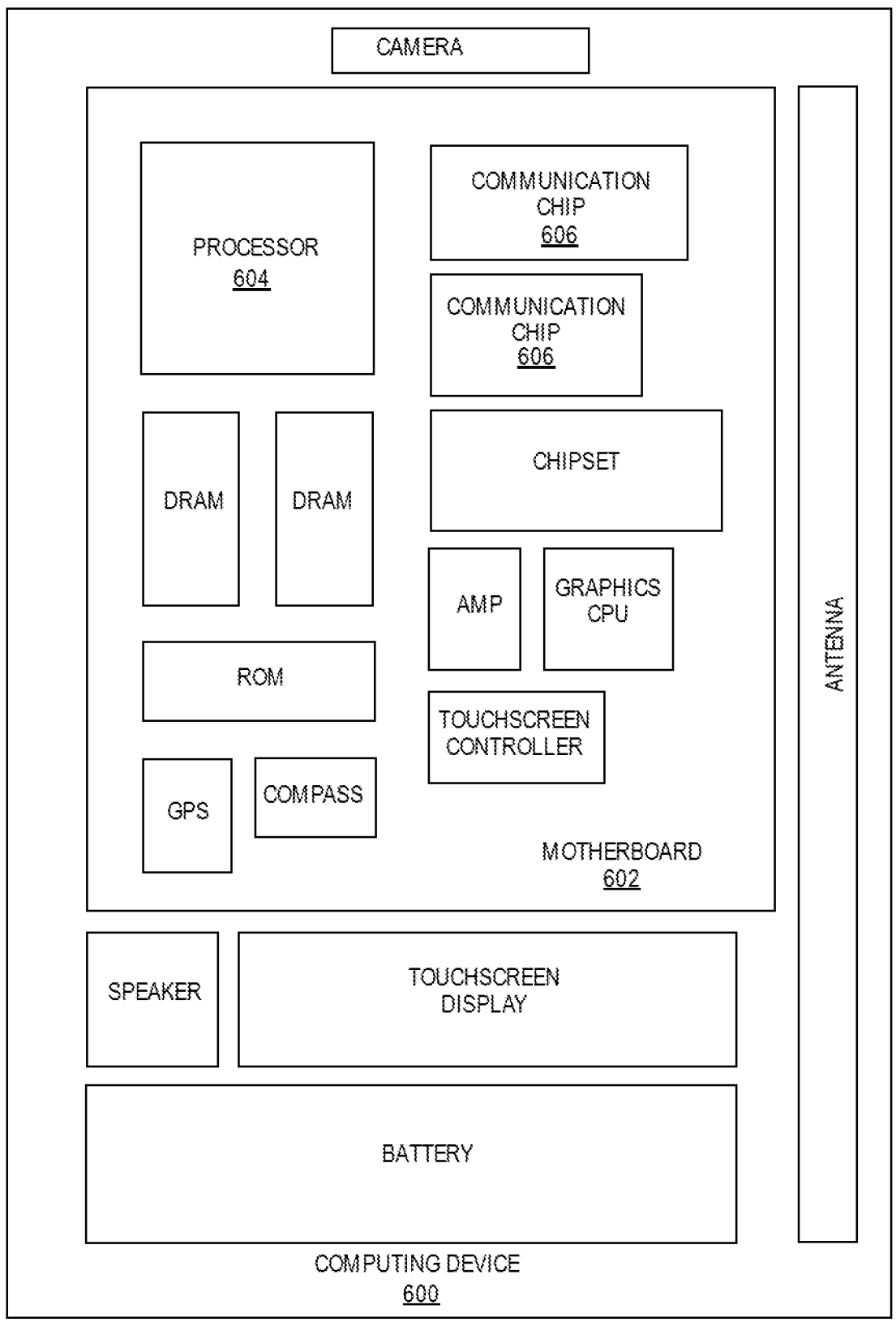
FIG. 6 illustrates a computing device in accordance with one implementation of an embodiment of the disclosure.

FIG. 6 illustrates a computing device 600 in accordance with one implementation of an embodiment of the disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In an embodiment, the integrated circuit die of the processor may comprise a PMOS transistor device with an interface layer between the semiconductor source/drain region and a barrier layer of the source/drain contact, as described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In an embodiment, the integrated circuit die of the communication chip may comprise a PMOS transistor device with an interface layer between the semiconductor source/drain region and a barrier layer of the source/drain contact, as described herein.

In further implementations, another component housed within the computing device 600 may comprise a PMOS transistor device with an interface layer between the semiconductor source/drain region and a barrier layer of the source/drain contact, as described herein.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
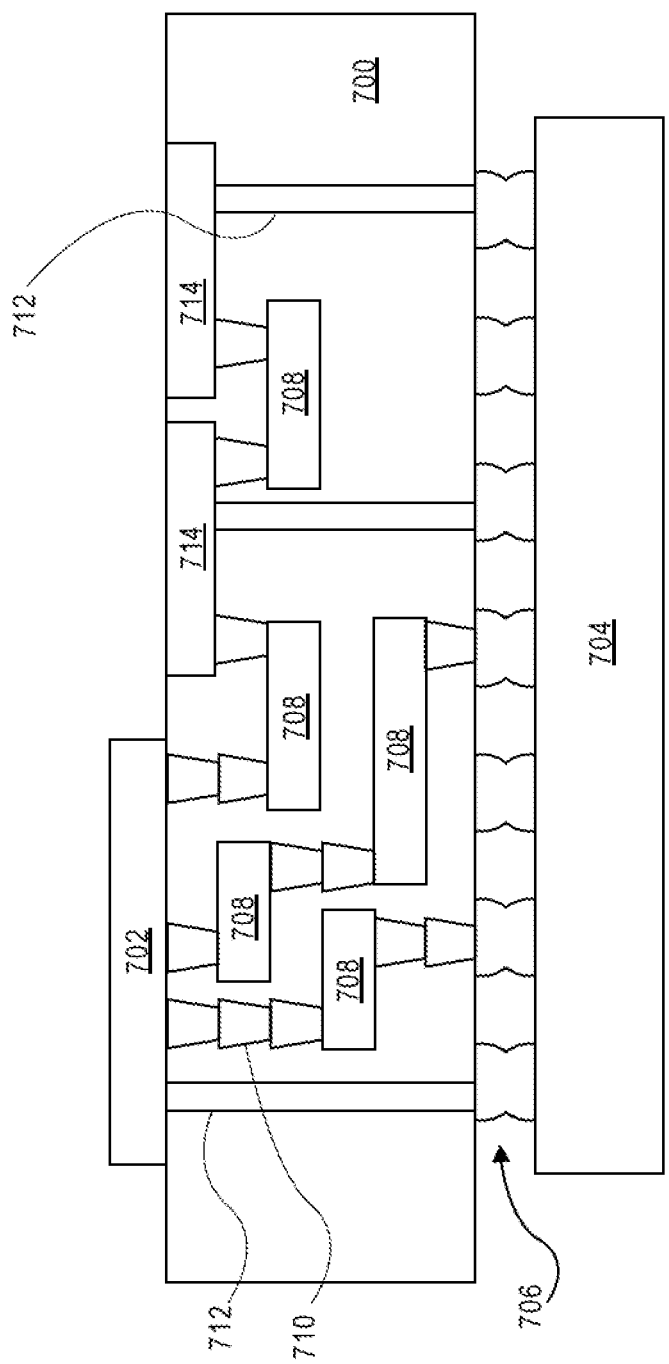
FIG. 7 is an interposer implementing one or more embodiments of the disclosure.

FIG. 7 illustrates an interposer 700 that includes one or more embodiments of the disclosure. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. In an embodiment, one of both of the first substrate 702 and the second substrate 704 may comprise a PMOS transistor device with an interface layer between the semiconductor source/drain region and a barrier layer of the source/drain contact, in accordance with embodiments described herein. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer 700 may be formed of alternate rigid or flexible materials that may include the same materials described above for use in a semiconductor substrate, such as silicon, germanium, and other group III-V and group IV materials.

The interposer 700 may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the disclosure, apparatuses or processes disclosed herein may be used in the fabrication of interposer 700.

Thus, embodiments of the present disclosure may comprise a PMOS transistor device with an interface layer between the semiconductor source/drain region and a barrier layer of the source/drain contact.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: A semiconductor device, comprising: a semiconductor channel; a gate stack over the semiconductor channel; a source region on a first end of the semiconductor channel; a drain region on a second end of the semiconductor channel; and contacts over the source region and the drain region, wherein contacts comprise: a silicon germanium layer; an interface layer over the silicon germanium layer; and a titanium-containing layer over the interface layer.

Example 2: the semiconductor device of Example 1, wherein the interface layer comprises more silicon than germanium.

Example 3: the semiconductor device of Example 2, wherein the germanium accounts for approximately 15 atomic percent or less of the interface layer.

Example 4: the semiconductor device of Examples 1-3, wherein boron is included in the interface layer.

Example 5: the semiconductor device of Example 4, wherein the boron has a concentration of approximately $3e^{21}$ atoms/cm$^3$ or more.

Example 6: the semiconductor device of Examples 1-5, wherein a thickness of the interface layer is between approximately 2 nm and approximately 6 nm.

Example 7: the semiconductor device of Examples 1-6, wherein the interface layer is diffused into the titanium layer.

Example 8: the semiconductor device of Examples 1-7, wherein the titanium-containing layer comprises approximately 95 atomic percent titanium or more.

Example 9: the semiconductor device of Examples 1-7, wherein the semiconductor device is a PMOS transistor.

Example 10: the semiconductor device of Example 9, wherein the PMOS transistor is a fin-FET transistor or a gate-all-around (GAA) transistor.

Example 11: the semiconductor device of Examples 1-10, wherein a contact resistance between the titanium layer and the silicon germanium layer is approximately $2e^{-9}$ ohm·cm$^2$ or lower.

Example 12: a semiconductor device, comprising: a source region; and a barrier layer over the source region, wherein the barrier layer comprises titanium, silicon, germanium, and boron.

Example 13: the semiconductor device of Example 12, wherein an atomic percentage of silicon is greater than an atomic percentage of germanium.

Example 14: the semiconductor device of Example 12 or Example 13, wherein a concentration of silicon in the barrier layer is greatest at an interface between the source region and the barrier layer.

Example 15: the semiconductor device of Examples 12-14, wherein the source region comprises silicon germanium.

Example 16: the semiconductor device of Examples 12-15, wherein an atomic percentage of germanium in the barrier layer proximate to the interface between the source region and the barrier layer is approximately 15 percent or lower.

Example 17: the semiconductor device of Examples 12-16, wherein a contact resistance between the source region and the barrier layer is approximately $2e^{-9}$ ohm·cm$^2$ or lower.

Example 18: an electronic system, comprising: a board; a package substrate coupled to the board; and a die coupled to the package substrate, wherein the die comprises a transistor device, wherein the transistor device comprises: a semiconductor channel; a gate stack over the semiconductor channel; a source region on a first end of the semiconductor channel; a drain region on a second end of the semiconductor channel; and contacts over the source region and the drain region, wherein contacts comprise: a silicon germanium layer; an interface layer over the silicon germanium layer; and a titanium layer over the interface layer.

Example 19: the electronic system of Example 18, wherein the transistor device is a fin-FET transistor or a gate-all-around (GAA) transistor.

Example 20: the electronic system of Example 18 or Example 19, wherein the interface layer is diffused into the titanium layer.

What is claimed is:

1. A semiconductor device, comprising:
a semiconductor channel;
a gate stack over the semiconductor channel;
a source region on a first end of the semiconductor channel;
a drain region on a second end of the semiconductor channel; and
a barrier layer over the source region, wherein the barrier layer comprises titanium, silicon, germanium, and boron throughout an entirety of the barrier layer.

2. The semiconductor device of claim 1, wherein an atomic percentage of silicon is greater than an atomic percentage of germanium in the single material layer.

3. The semiconductor device of claim 1, wherein a concentration of silicon in the barrier layer is greatest at an interface between the source region and the barrier layer.

4. The semiconductor device of claim 1, wherein the source region comprises silicon germanium.

5. The semiconductor device of claim 1, wherein an atomic percentage of germanium in the barrier layer proximate to the interface between the source region and the barrier layer is approximately 15 percent or lower.

6. The semiconductor device of claim 1, wherein the semiconductor device is configured to have a contact resistance between the source region and the barrier layer is approximately $2e^{-9}$ ohm·cm$^2$ or lower.

7. An electronic system, comprising:
a board;
a package substrate coupled to the board; and
a die coupled to the package substrate, wherein the die comprises a transistor device, wherein the transistor device comprises:

a semiconductor channel;
a gate stack over the semiconductor channel;
a source region on a first end of the semiconductor channel;
a drain region on a second end of the semiconductor channel; and
a barrier layer over the source region, wherein the barrier layer comprises titanium, silicon, germanium, and boron throughout an entirety of the barrier layer.

8. The electronic system of claim 7, wherein the transistor device is a fin-FET transistor or a gate-all-around (GAA) transistor.

\* \* \* \* \*